(12) United States Patent
Abdo

(10) Patent No.: US 10,345,678 B2
(45) Date of Patent: Jul. 9, 2019

(54) SUM FREQUENCY GENERATOR IN THE MICROWAVE DOMAIN FOR QUANTUM COMMUNICATION AND COMPUTATION APPLICATIONS

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/049,060

(22) Filed: Jul. 30, 2018

(65) Prior Publication Data

US 2018/0335683 A1 Nov. 22, 2018

Related U.S. Application Data

(63) Continuation of application No. 15/492,787, filed on Apr. 20, 2017, now Pat. No. 10,108,071, which is a continuation of application No. 15/295,251, filed on Oct. 17, 2016, now Pat. No. 9,680,452.

(51) Int. Cl.
| | |
|---|---|
| *G02F 1/35* | (2006.01) |
| *H03K 3/38* | (2006.01) |
| *G06N 10/00* | (2019.01) |
| *H04B 10/70* | (2013.01) |

(52) U.S. Cl.
CPC .......... *G02F 1/3534* (2013.01); *G02F 1/3526* (2013.01); *G06N 10/00* (2019.01); *H03K 3/38* (2013.01); *H04B 10/70* (2013.01)

(58) Field of Classification Search
None
See application file for complete search history.

(56) References Cited

U.S. PATENT DOCUMENTS

| | | | | |
|---|---|---|---|---|
| 7,180,645 B2* | 2/2007 | Azuma | .................. | G06N 10/00 |
| | | | | 359/107 |
| 7,893,708 B2* | 2/2011 | Baumgardner | ........ | G06N 10/00 |
| | | | | 326/7 |
| 8,724,213 B2* | 5/2014 | Thorhauge | ............ | G02F 1/3534 |
| | | | | 359/326 |
| 9,454,061 B1* | 9/2016 | Abdo | .................... | G02B 26/002 |
| 9,680,452 B1 | 6/2017 | Abdo | | |
| 2017/0093381 A1* | 3/2017 | Abdo | .................... | H01L 39/025 |
| 2018/0107092 A1 | 4/2018 | Abdo | | |

* cited by examiner

*Primary Examiner* — Jeffery S Zweizig
(74) *Attorney, Agent, or Firm* — Cantor Colburn LLP; Vazken Alexanian

(57) ABSTRACT

A technique relates to a circuit for a sum frequency generator. A first resonator is connected to a Josephson ring modulator (JRM), and the first resonator is configured to receive a first photon at a first frequency. A second resonator is connected to the JRM, and the second resonator is configured to have a first harmonic and no second harmonic. The second resonator is configured to receive a second photon at a second frequency, and the first resonator is configured to output an up-converted photon. The up-converted photon has an up-converted frequency that is a sum of the first frequency and the second frequency.

20 Claims, 10 Drawing Sheets

PROVIDE A FIRST RESONATOR CONNECTED TO A JOSEPHSON RING MODULATOR (JRM), WHEREIN THE FIRST RESONATOR IS CONFIGURED TO RECEIVE A FIRST PHOTON AT A FIRST FREQUENCY  805

PROVIDE A SECOND RESONATOR CONNECTED TO THE JRM, THE SECOND RESONATOR CONFIGURED TO HAVE A FIRST HARMONIC AND NO SECOND HARMONIC, WHEREIN THE SECOND RESONATOR IS CONFIGURED TO RECEIVE A SECOND PHOTON AT A SECOND FREQUENCY, WHEREIN THE FIRST RESONATOR IS CONFIGURED TO OUTPUT AN UP-CONVERTED PHOTON, THE UP-CONVERTED PHOTON HAVING AN UP-CONVERTED FREQUENCY THAT IS A SUM OF THE FIRST FREQUENCY AND THE SECOND FREQUENCY  810

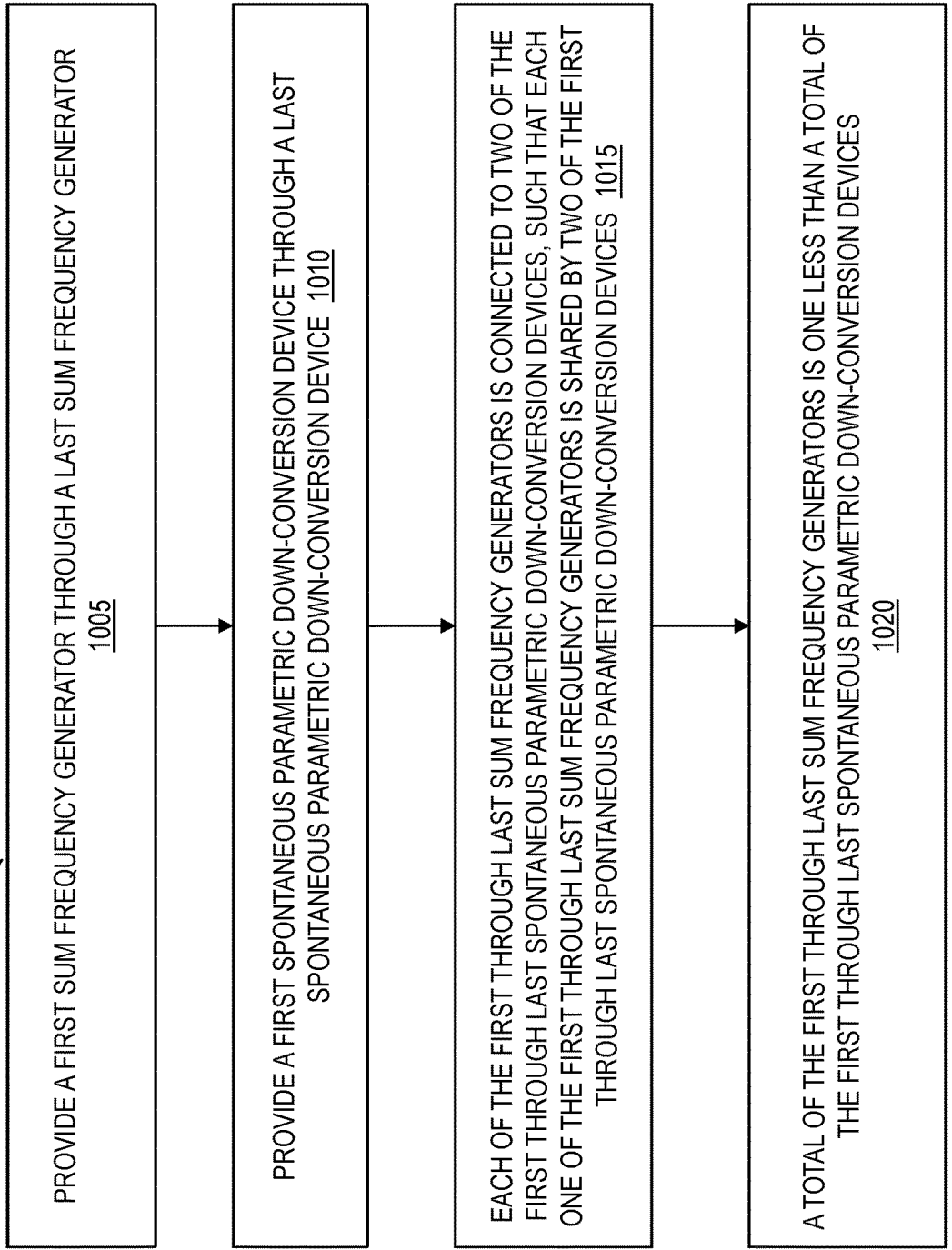

SUM FREQUENCY GENERATOR IN THE MICROWAVE DOMAIN FOR QUANTUM COMMUNICATION AND COMPUTATION APPLICATIONS

DOMESTIC PRIORITY

This application is a continuation of U.S. application Ser. No. 15/492,787, titled "SUM FREQUENCY GENERATOR IN THE MICROWAVE DOMAIN FOR QUANTUM COMMUNICATION AND COMPUTATION APPLICATIONS" filed Apr. 20, 2017, which is a continuation of U.S. application Ser. No. 15/295,251, titled "SUM FREQUENCY GENERATOR IN THE MICROWAVE DOMAIN FOR QUANTUM COMMUNICATION AND COMPUTATION APPLICATIONS" filed Oct. 17, 2016, and which is now U.S. Pat. No. 9,680,452. The contents of each application are incorporated by reference herein in their entirety.

BACKGROUND

The present invention relates to superconducting electronic devices, and more specifically, to a sum frequency generator in the microwave domain for quantum communication applications.

Quantum entanglement is a physical phenomenon that occurs when pairs or groups of particles are generated or interact in ways such that the quantum state of each particle cannot be described independently of the others, even when the particles are separated by a large distance. Instead, a quantum state must be described for the system as a whole. To put it another way, an entangled system is defined to be one whose quantum state cannot be factored as a product of states of its local constituents. In other words, they are not individual particles but are an inseparable whole. In entanglement, one constituent cannot be fully described without considering the other(s). Note that the state of a composite system is always expressible as a sum, or superposition, of products of states of local constituents.

SUMMARY

According to one or more embodiments, a circuit for a sum frequency generator is provided. The circuit includes a first resonator connected to a Josephson ring modulator (JRM), where the first resonator is configured to receive a first photon at a first frequency. The circuit includes a second resonator connected to the JRM, and the second resonator is configured to have a first harmonic and no second harmonic. The second resonator is configured to receive a second photon at a second frequency, and the first resonator is configured to output an up-converted photon. The up-converted photon has an up-converted frequency that is a sum of the first frequency and the second frequency.

According to one or more embodiments, a method of forming a circuit for a sum frequency generator is provided. The method includes providing a first resonator connected to a Josephson ring modulator (JRM), where the first resonator is configured to receive a first photon at a first frequency. The method includes providing a second resonator connected to the JRM, and the second resonator is configured to have a first harmonic and no second harmonic. The second resonator is configured to receive a second photon at a second frequency, and the first resonator is configured to output an up-converted photon. The up-converted photon has an up-converted frequency that is a sum of the first frequency and the second frequency.

According to one or more embodiments, a method for remote entanglement of a first qubit and a second qubit is provided. The method includes providing a sum frequency generator circuit separately connected to a first quantum system and a second quantum system. The first quantum system includes the first qubit and the second quantum system includes the second qubit. The method includes remotely entangling the first qubit and the second qubit. The remote entanglement includes causing the first quantum system to transmit a first output readout signal at a first frequency to the sum frequency generator and causing the second quantum system to transmit a second output readout signal at a second frequency to the sum frequency generator circuit. Also, the remote entanglement includes outputting, by the sum frequency generator, an up-converted output readout signal having an up-converted frequency that is a sum of the first frequency and the second frequency, thereby remotely entangling the first qubit and the second qubit.

According to one or more embodiments, a method for configuring a microwave repeater is provided. The method includes providing a first sum frequency generator through a last sum frequency generator and providing a first spontaneous parametric down-conversion device through a last spontaneous parametric down-conversion device. Each of the first through last sum frequency generators is connected to two of the first through last spontaneous parametric down-conversion devices, such that each one of the first through last sum frequency generators is shared by two of the first through last spontaneous parametric down-conversion devices. A total of the first through last sum frequency generators is one less than a total of the first through last spontaneous parametric down-conversion devices.

BRIEF DESCRIPTION OF THE DRAWINGS

FIG. 8 is a flow chart of a method of forming a circuit for the SFG according to one or more embodiments.

FIG. 10 is a flow chart of a method for configuring a microwave repeater according to one or more embodiments.

DETAILED DESCRIPTION

Figure 1:
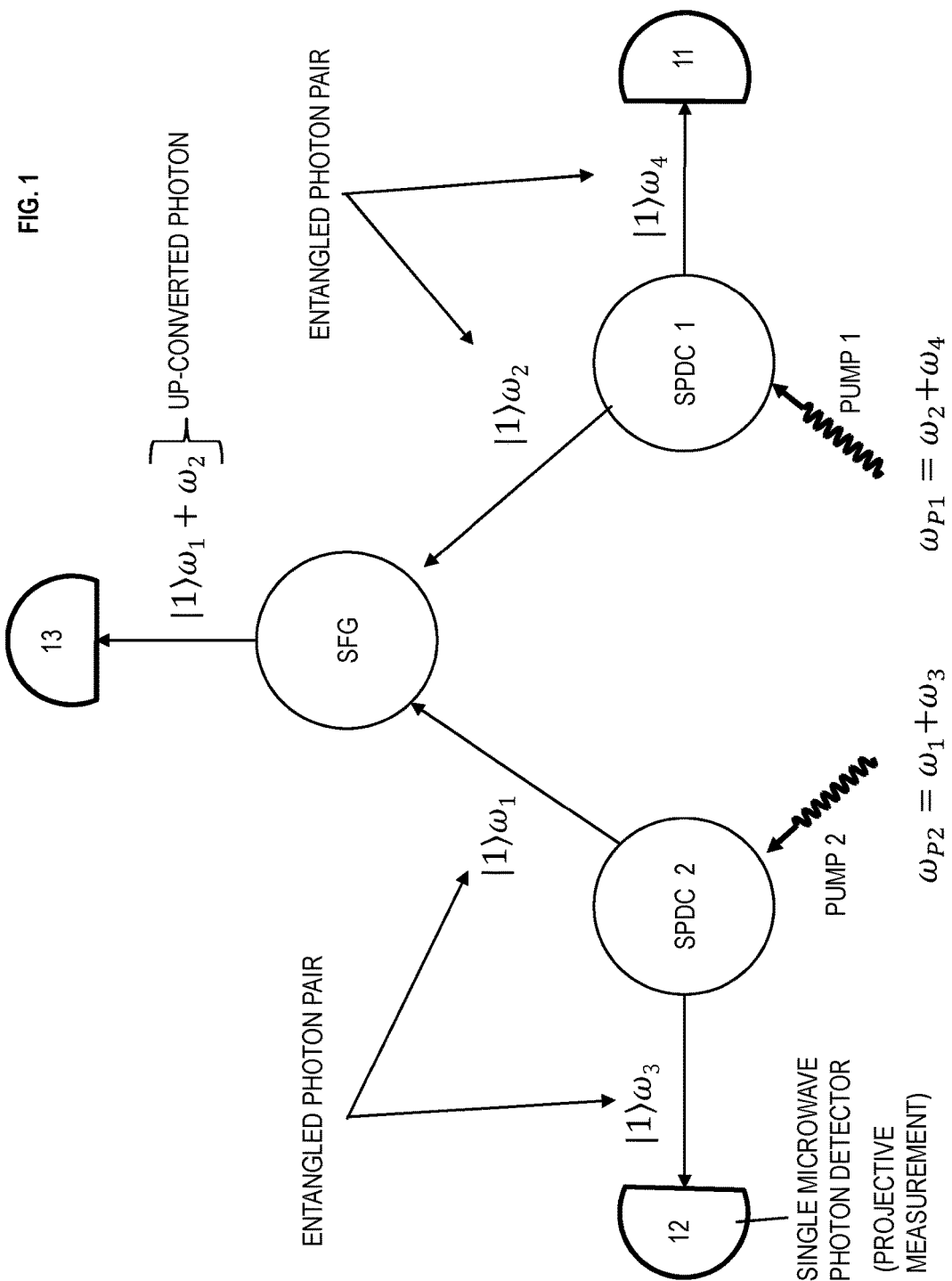
FIG. 1 is a conceptual view of an application for a sum frequency generator (SFG) in quantum communication according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

A photon is an elementary particle, which is a quantum of light along with all other forms of electromagnetic radiation. A photon carries energy proportional to the radiation frequency and has zero rest mass.

The Bell states are a concept in quantum information science and represent the essence of entanglement. They are subject to the Bell inequality. An EPR pair is a pair of qubits (quantum bits), particles, or photons, which are in a Bell state together, in other words, entangled with each other. Unlike classical phenomena such as the electromagnetic and gravitational fields, entanglement is invariant under distance of separation and is not subject to relativistic limitations such as the speed of light. The Bell measurement is an important concept in quantum information science. It is a joint quantum-mechanical measurement of two qubits that determines which of the four Bell states the two qubits are in. If the qubits were not in a Bell state before, they get projected into a Bell state (according to the projection rule of quantum measurements), and as Bell states are entangled, a Bell measurement is an entangling operation.

One useful feature of entanglement is that it can be swapped. For example, given two pairs of entangled photons, e.g., A, B, and C, D, where each pair is generated by a separate spontaneous photon down-converter (SPDC), it is possible to entangle the photons A and D (without having them interact with each other) by performing a joint measurement of photons B and C in the Bell basis and communicating the result to A and D. One application where this quantum operation (i.e., entanglement swapping) can be useful is quantum communication. In particular, it enables the implementation of quantum repeaters. However, using linear optical elements to perform partial Bell measurement in entanglement swapping schemes (in which a successful Bell measurement serves as a heralding event for the creation of entangled pair) suffer from several problems. For example, one problem is that spontaneous parametric down-conversion (SPDC) sources inherently emit multipairs of entangled photons, which reduces the fidelity of the entangled state conditioned on a successful Bell measurement and makes the entanglement swapping protocol useless without post-selecting the events corresponding to one detection at both ends A and D. Furthermore, in addition to reducing the fidelity, post-selection operation by itself is incompatible with the requirements of device-independent quantum key distribution (DIQKD) schemes (needed in order to perform secure quantum communications). Another problem is that all optical tests of Bell's inequality suffer from the detection loophole where entangled photons are not all detected due to unavoidable losses in the quantum channel, losses in the coupling between the photon-pair source and the optical fiber, and the finite detector efficiency. Closing this loophole is a requirement for demonstrating DIQKD. One viable solution to these problems and others which have been proposed in the literature is using a sum-frequency generator (which in a way serves as a nonlinear filter) instead of the linear optical elements which are used to perform the Bell measurement in the entanglement swapping operation/protocol.

One or more embodiments provide a quantum device that operates in the microwave domain (e.g., 1-30 gigahertz (GHz)). The quantum device is capable of performing nonlinear optics operations on chip, specifically sum frequency generation, i.e., up-converting a pair of microwave photons entering the ports of the quantum device at frequencies $f_S$, $f_I$ and momenta $k_S$, $k_I$ to an outgoing photon whose energy is equal to the sum of the energy $f_{UPC}=f_I+f_S$ and whose momentum is equal to the sum of the momentum of the input photons $k_{UPC}=k_I+k_S$. One or more embodiments include a sum frequency generator (circuit) in the microwave domain that operates at the single photon level and can be utilized in various roles in quantum information processing applications, particularly, in quantum computation and quantum communication.

Now turning to the figures, FIG. 1 is a conceptual view of an application for the sum frequency generator in quantum communication according to one or more embodiments. FIG. 1 depicts SPDC 1 and SPDC 2 which are two independent photon pair sources with uncorrected spectra. An SFG is connected to each SPDC 1 and 2. Single microwave photon detectors 11, 12, and 13 are respectively connected to SPDC 1, SPDC 2, and SFG.

During operation, separate pump signals are input to SPDC 1 and 2. In this example, pump signal 1 (at frequency $\omega_{P1}=\omega_2+\omega_4$) is input to SPDC 1 and pump signal 2 (at frequency $\omega_{P2}=\omega_1+\omega_3$) is input to SPDC 2. The SPDC 1 is configured to create a pair of entangled photons, for example, according to Fock states. Similarly, the SPDC 2 is configured to create a pair of entangled photons.

The entangled photon pair generated by SPDC 1 is designated as photon $|1\rangle\omega_4$ which is transmitted to photon detector 11 and photon $|1\rangle\omega_2$ which is transmitted to the SFG. The entangled photon pair generated by SPDC 2 is designated as photon $|1\rangle\omega_3$ which is transmitted to photon detector 12 and photon $|1\rangle\omega_1$ which is transmitted to the SFG.

The SFG is configured to receive the photon $|1\rangle\omega_1$ and photon $|1\rangle\omega_2$ and up-convert the two photons ($|1\rangle\omega_1$ and $|1\rangle\omega_2$) to a converted photon $|1\rangle\omega_1+\omega_2$. The converted photon $|1\rangle\omega_1+\omega_2$ can be referred to as the up-converted photon. It is noted that the frequencies of the photons generated by SPDC 1 are $\omega_2$ and $\omega_4$, and the frequencies of the photons generated by SPDC 2 are $\omega_1$ and $\omega_3$. Accordingly, the converted photon $|1\rangle\omega_1+\omega_2$ is the sum frequency of $\omega_1+\omega_2$. By measuring the converted (i.e., up-converted) photon $|1\rangle\omega_1+\omega_2$ with single microwave photon detector, the converted photon heralds the entanglement of the of the other two photon states at a distance. In other words, measuring the converted (i.e., up-converted) photon $|1\rangle\omega_1+\omega_2$ confirms with a certainty the entanglement of photons $|1\rangle\omega_3$ and $|1\rangle\omega_4$ which are distant from each other. Further, this scheme results in a photon triplet state in which 3 photons are entangled. The photon triplet state of the 3 entangled photons is the entanglement of the converted photon $|1\rangle\omega_1+\omega_2$, the photon $|1\rangle\omega_3$, and the photon $|1\rangle\omega_4$.

Figure 2:
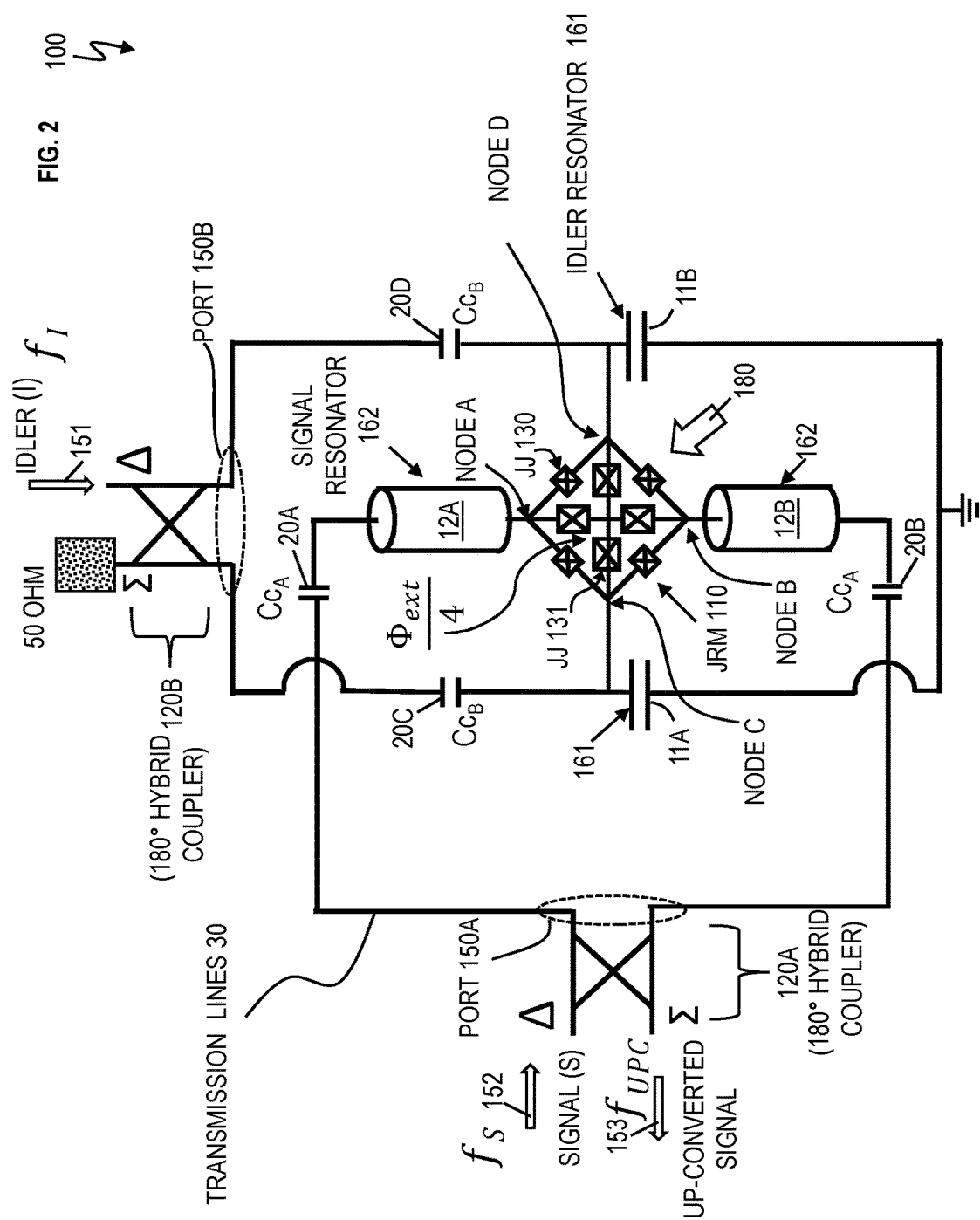
FIG. 2 is a schematic of an SFG circuit according to one or more embodiments.

FIG. 2 is a schematic of an SFG circuit 100 according to one or more embodiments. The SFG circuit 100 is a microwave device or quantum device. The SFG circuit 100 includes port 150A and port 150B. The port 150A can be connected to a broadband 180 degree hybrid coupler 120A, and the port 150B can be connected to a broadband 180 degree hybrid coupler 120B. The 180 degree hybrid couplers 120A and 120B each have a difference (Δ) port and a sum (Σ) port. For 180 degree hybrid coupler 120A, the signal (S) is connected to the Δ port and the up-converted (UPC) signal is connected to the Σ port. For 180 degree hybrid coupler 120B, the idler (I) is connected to the Δ port and a termination impendence point (e.g., 50 ohm (Ω) termination environment) is connected to the Σ port.

A 180° hybrid coupler is a 4-port microwave device that is reciprocal, matched, and ideally lossless. The 180° hybrid splits an input signal into two equal amplitude outputs. When fed from its sum port (Σ), the 180° hybrid provides two equal-amplitude in-phase output signals. When fed from its difference port (Δ), it provides two equal amplitude 180° out-of-phase output signals.

The SFG circuit 100 includes a Josephson junction ring modulator (JRM) 110. The JRM 110 includes multiple Josephson junctions (JJ) 130 connected together to form the loop/ring in the JRM 110, which is similar to a Wheatstone bridge. In one implementation, the JRM 110 can also include JJs 131 inside the loop such that one end of each JJ 131 connects to a node of the loop of the JRM 110 while the other end of each JJ 131 is connected to the other JJs 131. As understood by one skilled in the art, an applied magnetic flux Φ threads the loop of the MJRM 110, and the magnetic field can be generated by a magnetic source 180, such as a magnetic coil. In this example, the magnetic flux Φ threading each one of the reduced inner loops of the JRM is $\Phi_{ext}/4$.

A signal resonator 162 includes two quarter-wavelength transmission lines 12A and 12B. One quarter-wavelength transmission line 12A is connected to Node A, and the other quarter-wavelength transmission line 12B is connected to Node B of the JRM 110. These two quarter-wavelength transmission lines and the JRM 110 form a half-wavelength ($\lambda_S/2$) transmission line microwave resonator for the fundamental mode whose wavelength is $\lambda_S$, which matches the wavelength of the input microwave signal 152. The quarter-wavelength transmission lines 12A and 12B of the signal resonator 162 connect to opposite ends of the JRM 110.

An idler resonator 161 includes two lumped-element capacitors 11A and 11B each with the value the $2C_B$, where C represents capacitance. One lumped-element capacitor 11A is coupled to node C and the other lumped-element capacitor 11B is coupled to node D of the JRM 110. The lumped-element capacitors 11A and 11B of the idler resonator 161 connect to opposite ends of the JRM 110.

The idler resonator 161 and the signal resonator 162 both share or utilize the JRM 110. In one implementation, both the idler resonator 161 and the signal resonator 162 have the same resonance frequency as depicted in the frequency spectrum of FIG. 3. In another implementation, the idler resonator 161 and the signal resonator 162 have different resonance frequencies in which the idler resonator 161 has a higher resonance frequency than the signal resonator 162 as depicted in the frequency spectrum in FIG. 4

A microwave component/element is described as lumped (versus distributed) if its dimensions are very small compared to the wavelength of the minimum working frequency (e.g., smaller than 1/10 of the wavelength corresponding to the minimum operational frequency of the device). For example, Josephson junctions are considered to a very good approximation, as lumped nonlinear inductors for microwave signals in the range 1-20 GHz.

The SFG circuit 100 includes coupling capacitors 20A and 20B which connect the port 150A to the signal resonator 162. Also, the SFG circuit 100 includes coupling capacitors 20C and 20D which connect the port 150B to the idler resonator 161. The coupling capacitors pair 20A, 20B (and the pair 20C, and 20D) each have the same value, and this value is designated $Cc_A$ in coupling capacitors 20A, 20B and $Cc_B$ in coupling capacitors 20C, 20D. The value of coupling capacitors 20A, 20B, 20C, and 20D is mainly determined such that it sets a desirable bandwidth for the idler resonator 161 and the signal resonator 162 (without sacrificing the device stability as would be understood by one skilled in the art).

The idler microwave signal/tone 151 is at the frequency $f_I$, and the signal microwave signal/tone 152 is at the frequency $f_S$. The up-converted microwave signal/tone 153 is at the frequency $f_{UPC}$. The idler microwave signal 151 (idler photon) and the signal microwave signal 152 (signal photon) are input into the SFG circuit 100 and up-converted to generate up-converted microwave signal 153 (up-converted signal).

Characteristics of the SFG circuit 100 are discussed below. The signal resonator 162 can also be referred to as resonator a, and the signal resonator 162 has the resonance frequency $f_a$. The idler resonator 161 can also be referred to as resonator b, and the idler resonator 161 has the resonance frequency $f_b$. The signal resonator 162 and the idler resonator 161 are designed to have their resonance frequencies ($f_a$ and $f_b$) equal or about equal such that $f_a \sim f_b$. The idler resonator 161 is a lumped-element resonator and does not have a second harmonic. The signal resonator 162 is not a lumped-element resonator and does have a second harmonic at a resonance frequency $f_c$. The second harmonic of resonator a at the resonance frequency $f_c$ satisfies the relation $f_c = 2f_a$. The second harmonic of resonator a at the resonance frequency $f_c$ is designated for simplicity as the resonance frequency of resonator c.

The frequency $f_S$ (signal microwave signal 152) and the frequency $f_I$ (idler microwave signal 151) are within the device bandwidth of the SFG 100 and have the characteristic where they are equal or about equal such that $f_S = f_I$. As an example, the frequencies can be $f_S = f_I = 7$ GHz. The frequency $f_{UPC}$ of the up-converted signal 153 (i.e., the up-converted photon) is the sum of the frequencies $f_S$ and $f_I$, such that output up-converted frequency $f_{UPC}$ satisfies the relation $f_{UPC} = f_S + f_I$ (e.g., 14 GHz). The sum frequency $f_{UPC}$ of the up-converted photon falls within the bandwidth of the $2f_a$ resonance mode.

The signal resonator 162 (resonator a) has a bandwidth designated as $\gamma_a$, and the idler resonator 161 (resonator b) has a bandwidth designated as $\gamma_b$. The second harmonic of the signal resonator 162 has a bandwidth designated as $\gamma_c$. In other words, resonator c has bandwidth designated as $\gamma_c$. The bandwidths satisfy the relation $\gamma_a \sim \gamma_b < \gamma_c$.

Also, the bandwidths satisfy the relation $\gamma_a$, $\gamma_b \ll g_3$, $\gamma_{2ph} \ll \gamma_c$, where $g_3$ is the coupling constant between the three modes a, b, and c, and characterizes the rate at which a pair of signal and idler photons are up-converted in the SFG circuit 100, where $\gamma_{2ph}$ is the rate at which signal and idler photons (via signal and idler microwave signals 152 and 151) leave their respective ports 150A and 150B (i.e., output in reflection), and where $\gamma_{2ph} = 4 g_3^2/\gamma_c$. In the SFG circuit 100, bandwidth $\gamma_c$ is to be larger than the bandwidth $\gamma_a$ and bandwidth $\gamma_b$ such that the up-converted photon (i.e., up-converted photon in the up-converted signal 153) leaves the SFG circuit 100 in time, and having the larger bandwidth $\gamma_c$ prevents the up-converted photon from having an opportunity to be down-converted. It is noted that a 3-wave mixing process (non-linear mixing) taking place in the SFG generates the up-converted photon out of the signal photon and the idler photon.

The SFG 100 including the capacitors 11A-B and 20A-D (with the exception of the dielectric material in the capacitors), transmission lines 30, Josephson junctions 130, 131 (with the exception of the thin insulating material), and ports 150A and 150B are made of superconducting material. Additionally, the hybrid couplers 120A and 120B are made of low loss normal metals or can be made of superconducting material. Examples of superconducting materials (at low temperatures, such as about 10-100 millikelvin (mK), or about 4 K) include niobium, aluminum, tantalum, etc.

Figure 3:
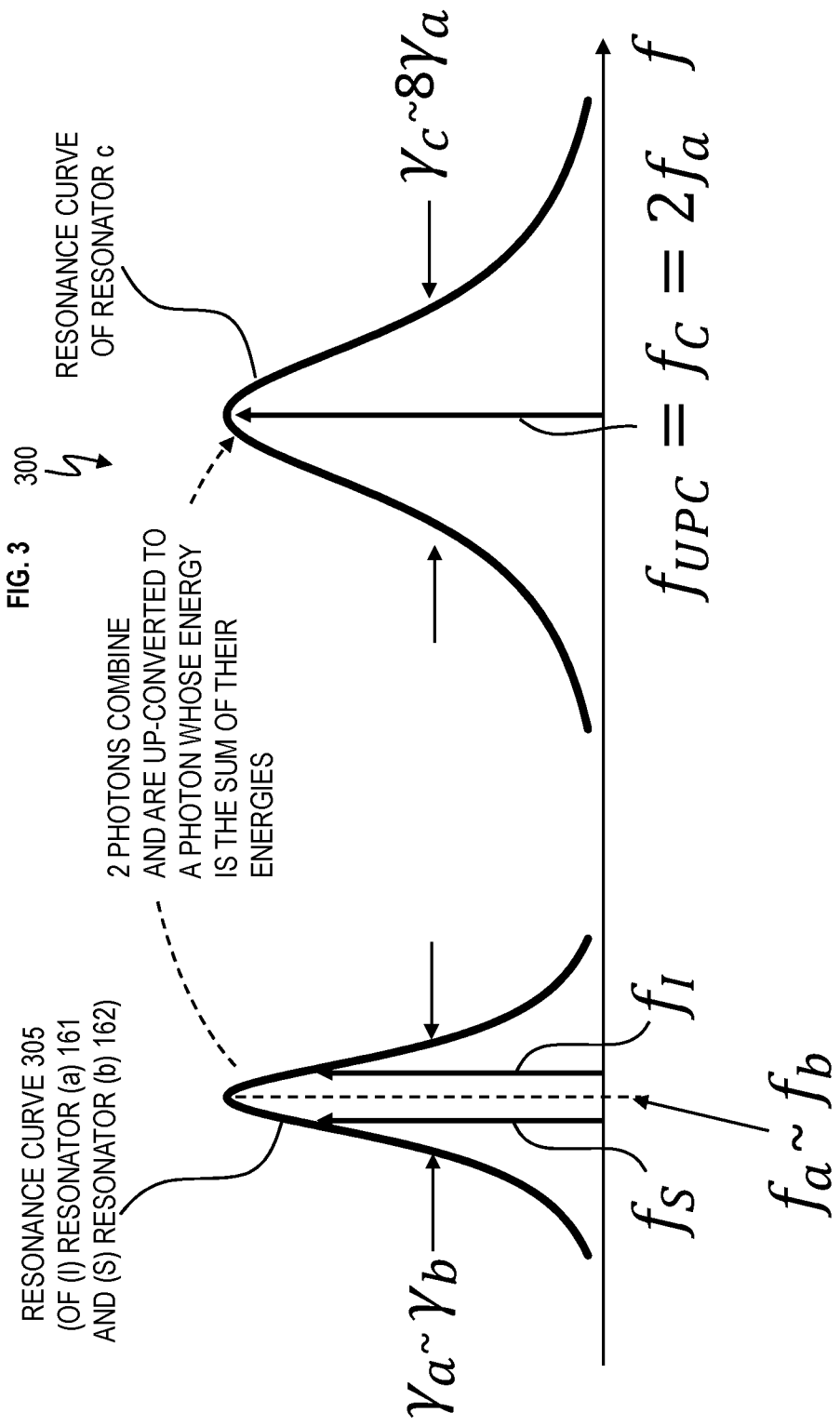
FIG. 3 depicts an example frequency spectrum according to one or more embodiments.

FIG. 3 depicts an example frequency spectrum 300 according to one or more embodiments. In this example, the resonance frequency $f_a$ of signal resonator 162 (i.e., resonator a) and the resonance frequency $f_b$ of idler resonator 161 (resonator b) coincide with one another (i.e., are equal or about equal) as shown by the curve 305. In the frequency spectrum 300, the bandwidths ($\gamma_a \sim \gamma_b$) of the signal resonator 162 and the idler resonator 161 are equal or about equal.

The signal photon (which can be utilized interchangeably with the signal microwave signal 152) is input at the frequency $f_S$, and the frequency $f_S$ is within the bandwidth $\gamma_a$ of the signal resonator 162 (resonator a). The idler photon (which can be utilized interchangeably with the idler microwave signal 151) is input at the frequency $f_I$, and the frequency $f_I$ is within the bandwidth $\gamma_b$ of the idler resonator 161 (resonator b). in one implementation, frequency $f_S$ can be about equal to the resonance frequency $f_a$, and frequency $f_I$ can be about equal to the resonance frequency $f_b$.

Because the signal resonator 162 has a second harmonic resonance mode (designated as a resonance mode of resonator c) and because of the interaction in the JRM 110, the signal and idler protons combine and are up-converted to a photon (identified as the up-converted photon of the up-converted signal 153) whose energy is the sum of the energies of the signal and idler photons. The up-converted photon has a frequency $f_{UPC} = f_c = 2 \cdot f_a$. In other words, the frequency $f_{UPC}$ is at the second harmonic of the signal resonator 162 (resonator a), which is about 2 times the signal resonance frequency $f_a$ of the signal resonator 162. The bandwidth $\gamma_c$ of the second harmonic (i.e., resonator c) is about 8 times the bandwidth $\gamma_a$ of the signal resonator 162 (resonator a), such that $\gamma_c \sim 8 \cdot \gamma_a$. In another implementation, the bandwidth $\gamma_c$ can be about 7, 8, 9, and/10 times higher than bandwidth $\gamma_a$. The frequency spectrum in FIG. 3 satisfies the relation $\gamma_a, \gamma_b \ll g_3, \gamma_{2ph} \ll \gamma_c$.

Figure 4:
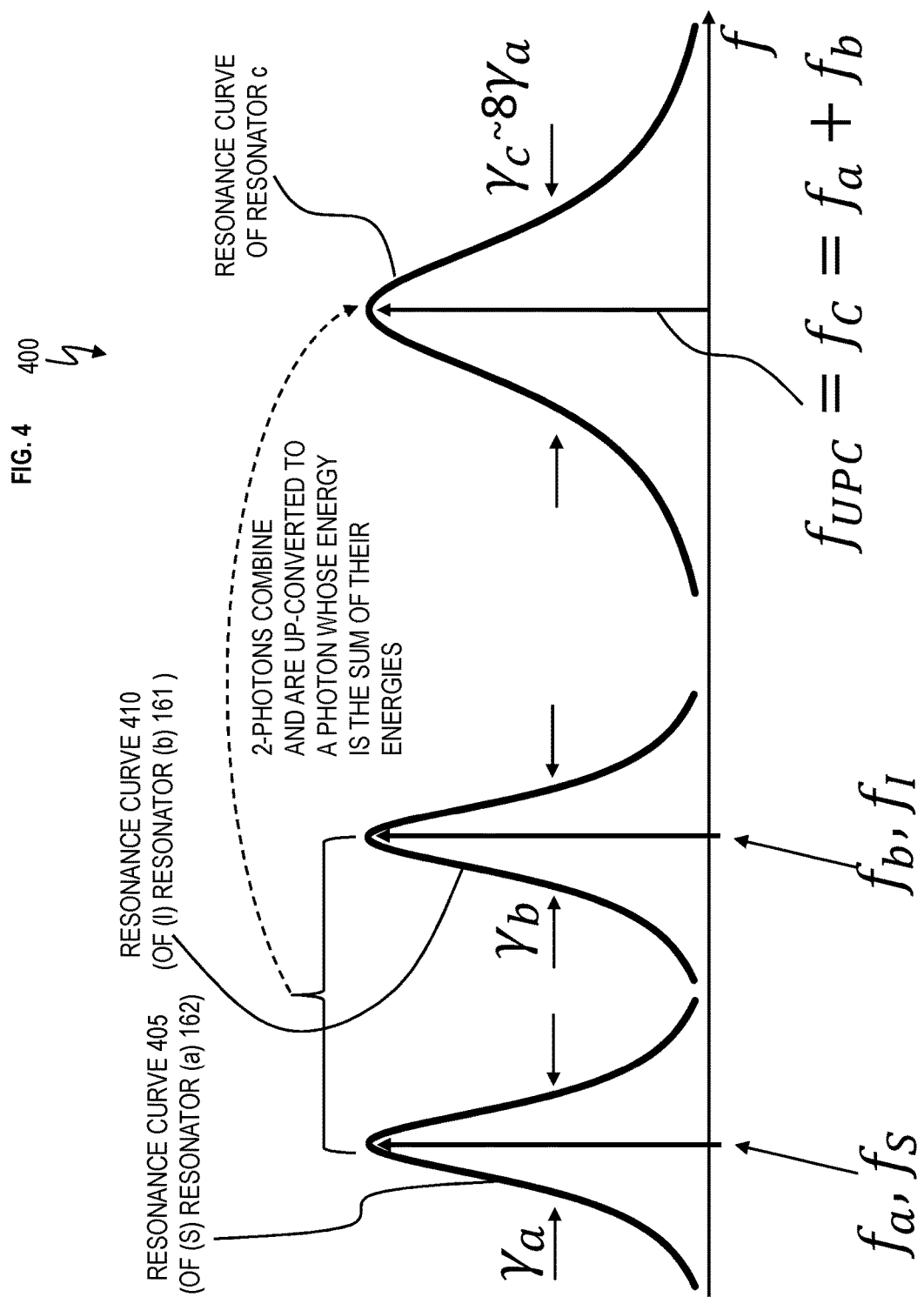
FIG. 4 depicts an example frequency spectrum according to one or more embodiments.

FIG. 4 depicts an example frequency spectrum 400 according to one or more embodiments. In this example, the resonance frequency $f_a$ of signal resonator 162 (i.e., resonator a) and the resonance frequency $f_b$ of idler resonator 161 (resonator b) do not coincide with one another as shown by the curves 405 and 410. In the frequency spectrum 400, the bandwidths ($\gamma_a \sim \gamma_b$) of the signal resonator 162 and the idler resonator 161 are separate and do not coincide with one another.

The signal photon (of the signal microwave signal 152) is input at the frequency $f_S$, and the frequency $f_S$ is within the bandwidth $\gamma_a$ of the signal resonator 162 (resonator a). The idler photon (of the idler microwave signal 151) is input at the frequency $f_I$, and the frequency $f_I$ is within the bandwidth $\gamma_b$ of the idler resonator 161 (resonator b).

Because the signal resonator 162 has a second harmonic resonance mode (designated as a resonance mode of resonator c) and because of the interaction in the JRM 110, the signal and idler protons combine and are up-converted to a photon (identified as the up-converted photon of the up-converted signal 153) whose energy is the sum of the energies of the signal and idler photons. Unlike FIG. 3, the frequency spectrum 400 in FIG. 4 shows that the up-converted photon has a frequency $f_{UPC} = f_c = f_a + f_b$. Although $f_c$ should be $2f_a$ for a uniform transmission line resonator, the inductors (i.e., JJs 130) can skew the second harmonic resonance mode frequency of the signal resonator 162. In such a case, an embodiment can be engineered in which the resonance frequencies $f_a$ and $f_b$ are different for resonators a and b and where their sum is $f_c$. The signal resonator 162 (resonator a) can be set, for example, according to a predetermined length of the transmission line forming the resonator 162 (and the inductive loading of the JRM 110) to give a certain fundamental resonance frequency $f_a$ and a second harmonic resonance frequency $f_c$. Subsequently, the value of the resonance frequency $f_b$ of idler resonator 161 can be designed such that it is equal to the difference between the resonance frequency $f_c$ and $f_a$.

The idler resonator 161 is structured so that its resonance frequency $f_b$ is slightly higher than the resonance frequency $f_a$ of the signal resonator 162 in order to reach the condition $f_c = f_a + f_b$. For example, the resonance frequency $f_a$ can be 7 GHz and the resonance frequency of the second harmonic $f_c$ can be 15 GHz. In this scenario, the resonance frequency $f_c$ of the second harmonic is higher than $2 \cdot f_a$, and in this case, $f_b = 8$ GHz is engineered to be higher than $f_a$ as depicted in the frequency spectrum 400.

As discussed in FIG. 3, the bandwidth $\gamma_c$ of the second harmonic (i.e., resonator c) is about 8 times the bandwidth $\gamma_a$ of the signal resonator 162 (resonator a), such that $\gamma_c \sim 8 \cdot \gamma_a$. In another implementation, the bandwidth $\gamma_c$ can be about 7, 8, 9, and/10 times larger than bandwidth $\gamma_a$. The frequency spectrum in FIG. 4 satisfies the relation $\gamma_a, \gamma_b \ll g_3, \gamma_{2ph} \ll \gamma_c$.

For explanation purposes, a design example with feasible experimental parameters is provided for the SFG circuit 100. The parameters include $I_0 = 2 \cdot 10^{-7}$ amperes (A) where $I_0$ is the critical current of the outer JJs 130 of the JRM 110 (which are nominally identical), $L_{J0} = 1.6$ nanohenry (nH), where $L_{J0}$ is the inductance of the outer JJs 130 for zero applied flux in the JRM, and $L_J = 2.3$ nH where $L_J$ is the inductance for each JJ 130, for a certain working point of the device corresponding to applied flux $\Phi_{ext} \sim \Phi_0/2$, where $\Phi_0$ is the flux quantum. The inner JJs 131 are included in order to add frequency tunability to the device as recognized by one skilled in the art. In general, the critical current of these JJs 131 is designed to be about 2.5 times larger than $I_0$ of the outer JJs 130. Additional parameters include $\gamma_{a,b}/2\pi = 20$ megahertz (MHz), $\gamma_c/2\pi = 160$ MHz, $f_a = 6$ GHz, $f_b = 7.3$ GHz, $f_c = 13.3$ GHz, $C_B = 171$ femtofarads (fF), $g_3/2\pi = 65$ MHz, and $\kappa_{2ph}/2\pi = 105$ MHz. These parameters satisfy the inequality requirement $\gamma_a, \gamma_b \ll g_3, \gamma_{2ph} \ll \gamma_c$.

Figure 5:
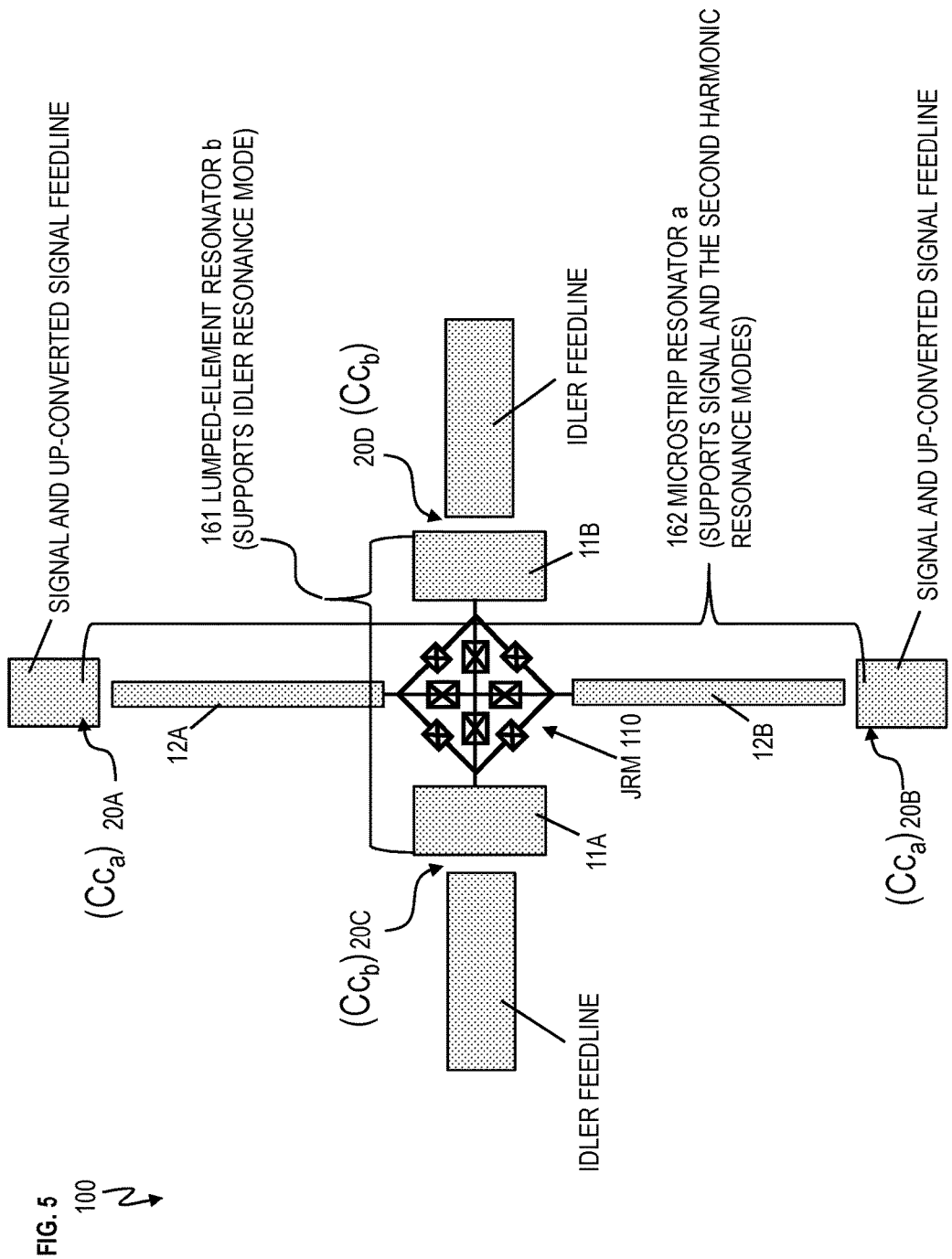
FIG. 5 depicts an example implementation of the SFG circuit according to one or more embodiments.

FIG. 5 is an example implementation of the SFG circuit 100 according to one or more embodiments. In FIG. 5, the half-wave transmission line resonator (i.e., 12A and 12B together with the JRM 110) of the signal resonator 162 is implemented as microstrips, striplines, coplanar waveguides, etc.

The lumped-element capacitors 11A and 11B of the idler resonator 161 are capacitors that have a common bottom plate or have common connection to a bottom plate which is not shown, and the common bottom plate is on another level (i.e., is not coplanar with the top plates of 11A and 11B). For example, dielectric material is under each top plate of the lumped-element capacitors 11A and 11B, and the lumped-element capacitors 11A and 11B share a common bottom plate connected to ground. The lumped-element capacitors 11A and 11B are connected to the JRM 110.

The half-wave transmission line resonator (i.e., 12A, 12B, and the JRM 110) of signal resonator 162 is coupled to the signal and up-converted signal feedlines via coupling capacitors 20A and 20B, which are shown in FIG. 5 in the form of gap capacitors (other forms of capacitances are possible, such as plate capacitance and interdigitated capacitance). Similarly, the lumped-element capacitors 11A and 11B of the idler resonator 161 are coupled to the idler feedlines via coupling capacitors 20C and 20D. The signal/up-converted signal and idler feedlines act as the respective ports 150A and 150B which connect to the respective 180 hybrid couplers 120A and 120B. The signal/up-converted signal and idler feedlines can be transmission lines.

Figure 6:
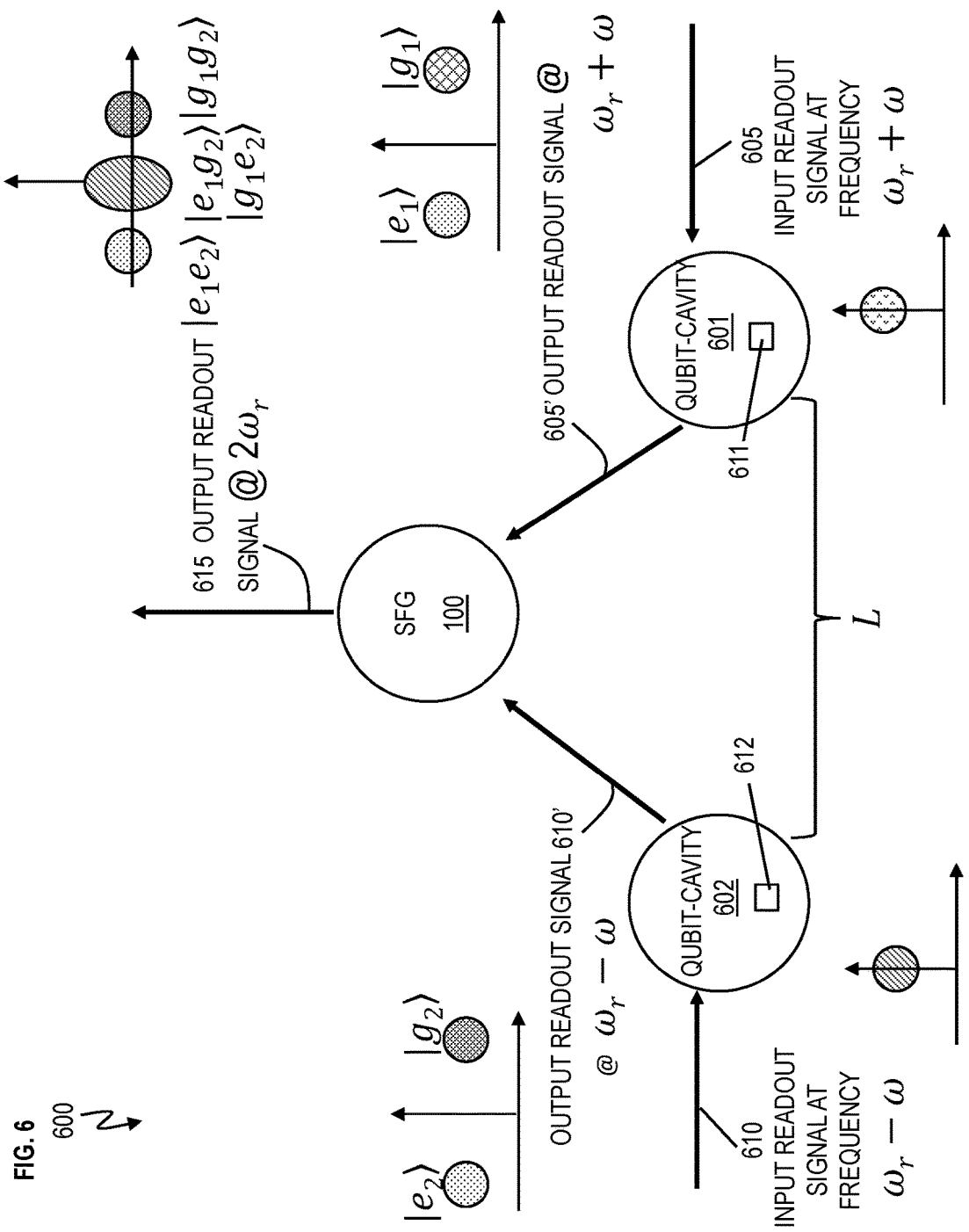
FIG. 6 depicts a system of an application utilizing the SFG circuit for remote entanglement between distant qubits according to one or more embodiments.

FIG. 6 depicts a system 600 of an application utilizing the SFG circuit 100 for remote entanglement between distant qubits 611 and 612 according to one or more embodiments. The system 600 includes the SFG circuit 100 coupled to qubit-cavity system 601 and qubit-cavity system 602. The qubit-cavity system 601 includes a cavity coupled to qubit 611. The qubit-cavity system 602 includes a cavity coupled to qubit 612. The qubit-cavity system 601 and 602 are a distance L away from each other. In one implementation, the distance L can be on the same chip such as 3 cm. In another implementation, the distance L can be 1 m (meter) on separate chips.

Example operation of the system 600 is now discussed. An input readout signal 605 at frequency $\omega_r+\omega$ is input to the qubit-cavity system 601. The qubit-cavity system 601 outputs the output readout signal 605' at frequency $\omega_r+\omega$, and the SFG circuit 100 receives the output readout signal 605' at frequency $\omega_r+\omega$ (i.e., signal microwave signal 152). The output readout signal 605' at frequency $\omega_r+\omega$ can be input into the Δ input of the hybrid coupler 120A of port 150A of SFG circuit 100. The output readout signal 605' contains state information of the qubit 611. One skilled in the art understands that the qubit-cavity system 601 includes a cavity or readout resonator coupled to the qubit 611, such that the cavity or readout resonator transmits the output readout signal 605' in response to the input readout signal 605.

An input readout signal 610 at frequency $\omega_r-\omega$ is input to the qubit-cavity system 602. The qubit-cavity system 602 outputs the output readout signal 610' at frequency $\omega_r-\omega$, and the SFG circuit 100 receives the output readout signal 610' at frequency $\omega_r-\omega$ (i.e., idler microwave signal 151). The output readout signal 610' at frequency $\omega_r-\omega$ can be input into the A input of the hybrid coupler 120B of port 150B of SFG circuit 100. The output readout signal 610' contains state information of the qubit 612. One skilled in the art understands that the qubit-cavity system 602 includes a cavity or readout resonator coupled to the qubit 612, such that the cavity or readout resonator transmits the output readout signal 610' in response to the input readout signal 610.

The output readout signal 605' is interchangeable with output readout photons 605', and the output readout signal 610' is interchangeable with output readout photons 610'. The output readout photons 605' can show, for example, a superposition of the energized state $|e_1\rangle$ and ground state $|g_1\rangle$ of the qubit, thereby containing the qubit state information of qubit 611. The output readout photon 610' can show, for example, a superposition of the energized state $|e_2\rangle$ and ground state $|g_2\rangle$ of the qubit, thereby containing the qubit state information of qubit 612.

In response to receiving the output readout photon 605' at frequency $\omega_r+\omega$ and the output readout photon 610' at frequency $\omega_r-\omega$, the SFG circuit 100 is configured to up-convert the photons 605' and 610', resulting in the (up-converted) converted photon 615 (output readout signal) at frequency $2\cdot\omega_r$. The up-converted photons 615 frequency is a sum of the frequencies $(\omega_r+\omega)+(\omega_r-\omega)$, resulting in $2\omega_r$.

The converted photons 610 (output readout signal) is a superposition of the following states: $|e_1e_2\rangle$, $|e_1g_2\rangle$, $|g_1e_2\rangle$, $|g_1e_2\rangle$. The converted photons 615 (or measurement of the converted photon 615) herald the remote entanglement distant qubits 611 and 612, which are distant from each other. The converted photons 610 (i.e., the up-converted photons 153) can be output via the Σ output of the hybrid coupler 120A of port 150A of SFG circuit 100.

Figure 7:
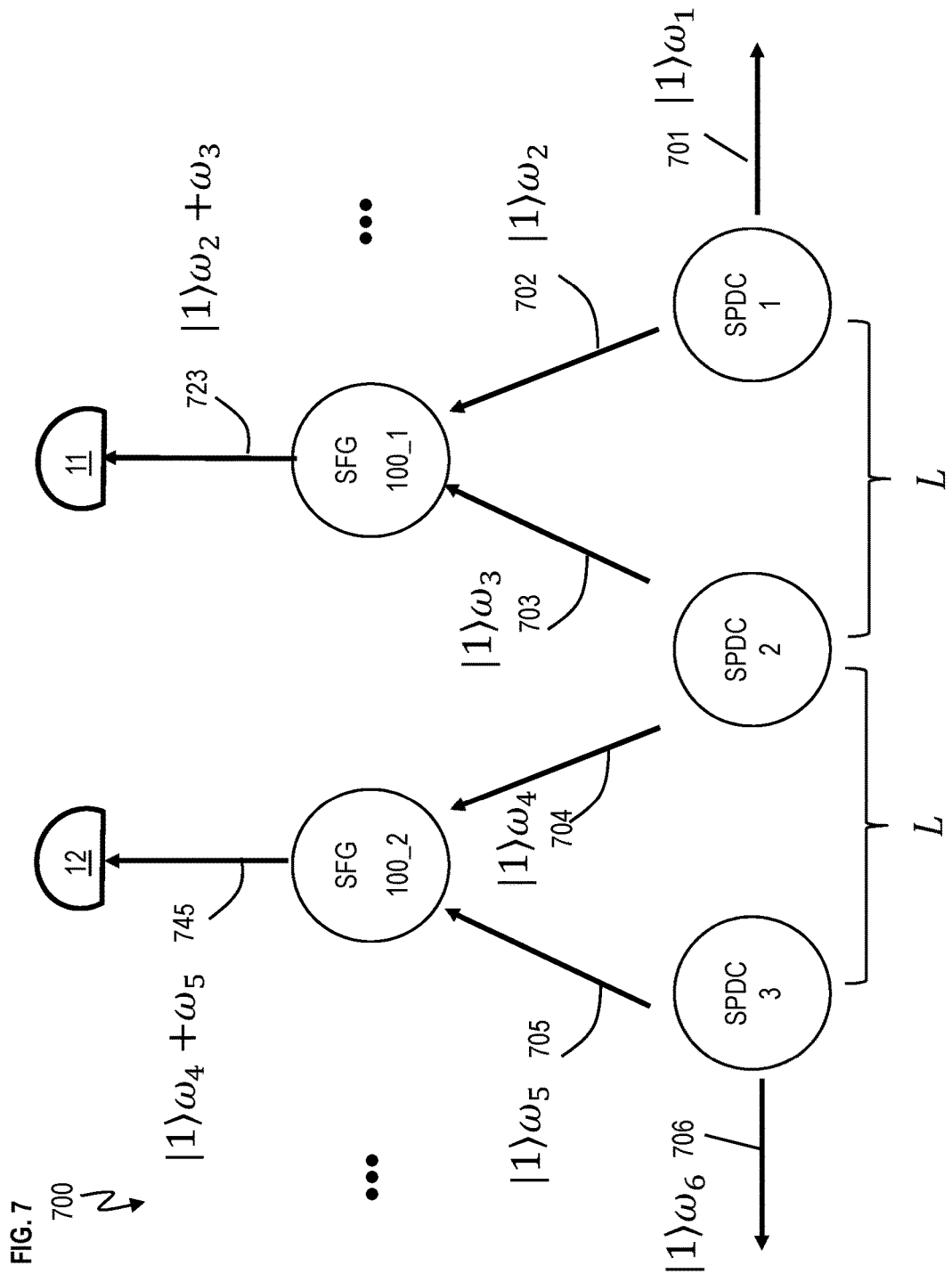
FIG. 7 depicts a system of utilizing the SFG circuit for application as quantum microwave repeater according one to one or more embodiments.

FIG. 7 is a system 700 of utilizing the SFG circuit 100 for application as a quantum microwave repeater according to one or more embodiments. A quantum microwave repeater (or quantum repeater) is an indispensable technology for constructing a long-distance secure photonic network. To distribute entanglement between two remote receivers, entanglement swapping operations at quantum repeater nodes in between are required. Accordingly, the system 700 can serve as quantum repeater nodes at predefined locations in the communication system.

The example system 700 includes SPDC 1, SPDC 2, and SPDC 3. The SPDC 1, 2, 3 can be a distance L from each other. In one implementation, the SPDC 1, 2, 3 can be a non-degenerate parametric amplifier, such as a Josephson parametric converter (JPC). Each SPDC 1, 2, 3 is coupled to an SFG circuit 100, designated as SFG 100_1 and 100_2 for explanation purposes. Each SPDC 1, 2, 3 is an independent photon pair source with uncorrelated spectra. Each SPDC 1, 2, 3 receives its own pump signal (not shown) and then generates a pair of entangled photons.

In FIG. 700, the SPDC 1 is configured to generate entangled photons 701 and 702. Photon 701 is at frequency $\omega_1$ while photon 702 is at frequency $\omega_2$. Photon 702 is transmitted from SPDC 1 to SFG 100_1.

The SPDC 2 is configured to generate entangled photons 703 and 704. Photon 703 is at frequency $\omega_3$ while photon 704 is at frequency $\omega_4$. Photon 703 is transmitted from SPDC 2 to SFG 100_1. Photon 704 is transmitted from SPDC 2 to SFG 100_2.

The SPDC 3 is configured to generate entangled photons 705 and 706. Photon 705 is at frequency $\omega_5$ while photon 706 is at frequency $\omega_6$. Photon 705 is transmitted from SPDC 3 to SFG 100_2.

In response to receiving photons 702 and 703 respectively at frequencies $\omega_2$ and $\omega_3$, the SFG 100_1 is configured to generate photon 723 at frequency $\omega_2+\omega_3$. The SFG 100_1 transmits photon 723 to photon microwave detector 11, where the photon microwave detector 11 detects the photon 723. For the SFG 100_1, the photons 702 and 703 can be received as the signal and idler photons 152, 151 respectively via ports 150A and 150B.

In response to receiving photons 704 and 705 respectively at frequencies $\omega_4$ and $\omega_5$, the SFG 100_2 is configured to generate photon 745 at frequency $\omega_4+\omega_5$. The SFG 100_2 transmits photon 745 to photon microwave detector 12, where the photon microwave detector 12 detects the photon 745. For the SFG 100_2, the photons 704 and 705 can be received as the signal and idler photons 152, 151 respectively via ports 150A and 150B.

The detection of photon 723 ($|1\rangle\,\omega_2+\omega_3$) by photon detector 11 and the detection of photon 745 by photon detector 12 ($|1\rangle\,\omega_4+\omega_5$) herald the remote entanglement of photons 701 ($|1\rangle\,\omega_1$) and 706 ($|1\rangle\,\omega_6$). The entangled photon pair 701 and 706 is created based on entanglement swapping.

It is noted that FIG. 7 shows one example of a quantum repeater setup that includes an array of three SPDCs and two SFGs, but the setup can be generalized/extended as necessary to N SPDCs with distance L between them and N−1 SFGs, (with one SFG between two sequential SPDCs).

FIG. 8 is a flow chart 800 of a method of forming a circuit for a sum frequency generator 100 according to one or more embodiments. At block 805, a first resonator 162 (e.g., signal resonator) is connected to a Josephson ring modulator (JRM) 110 is provided. The first resonator 162 is configured to receive a first photon 152 (e.g., signal microwave signal) at a first frequency $f_S$ which lies within the bandwidth of the fundamental resonance mode at $f_a$.

At block 810, a second resonator 161 (e.g., idler resonator) is connected to the JRM 110, and the second resonator 161 is configured to have a first harmonic and no second harmonic. The second resonator 161 is configured to receive a second photon 151 (e.g., idler microwave signal) at a second frequency $f_I$ which lies within the bandwidth of the fundamental resonance mode at $f_b$, and the first resonator 162 is configured to output an up-converted photon 153 (e.g., up-converted signal). The up-converted photon 153 has an up-converted frequency $f_{UPC}$ that is a combination of the first frequency $f_S$ and the second frequency $f_I$.

A fundamental resonance frequency is about the same for the first resonator ($f_a$) and the second resonator ($f_b$). The first frequency ($f_S$) of the first photon 152 and the second frequency ($f_I$) of the second photon 151 are about the same. Reference can be made to FIG. 3.

A fundamental resonance frequency of the second resonator ($f_b$) is higher than the first resonator ($f_a$). The second frequency ($k$) of the second photon 151 is higher than the first frequency ($f_S$) of the first photon 152. Reference can be made to FIG. 4

The first resonator 162 has a second harmonic configured to output the up-converted photon 153 at the up-converted frequency ($f_{UPC}$). The up-converted photon 153 is a sum of the energy from the first photon 152 and the second photon 151.

The first resonator 162 is a half-wavelength transmission line resonator (i.e., 12A, 12B, and the JRM 110) and the second resonator 161 is a lumped-element resonator (i.e., 11A, 11B, and the JRM 110). The first resonator 162 is formed of two microstrip sections that intersect at a JRM 110 at the center. The second resonator 161 is formed of capacitors 11A and 11B, each having a top plate connected to the JRM 110 and a bottom plate connected together (e.g., via ground). The top plate and bottom plate are separated by a dielectric substrate or medium.

Figure 9:
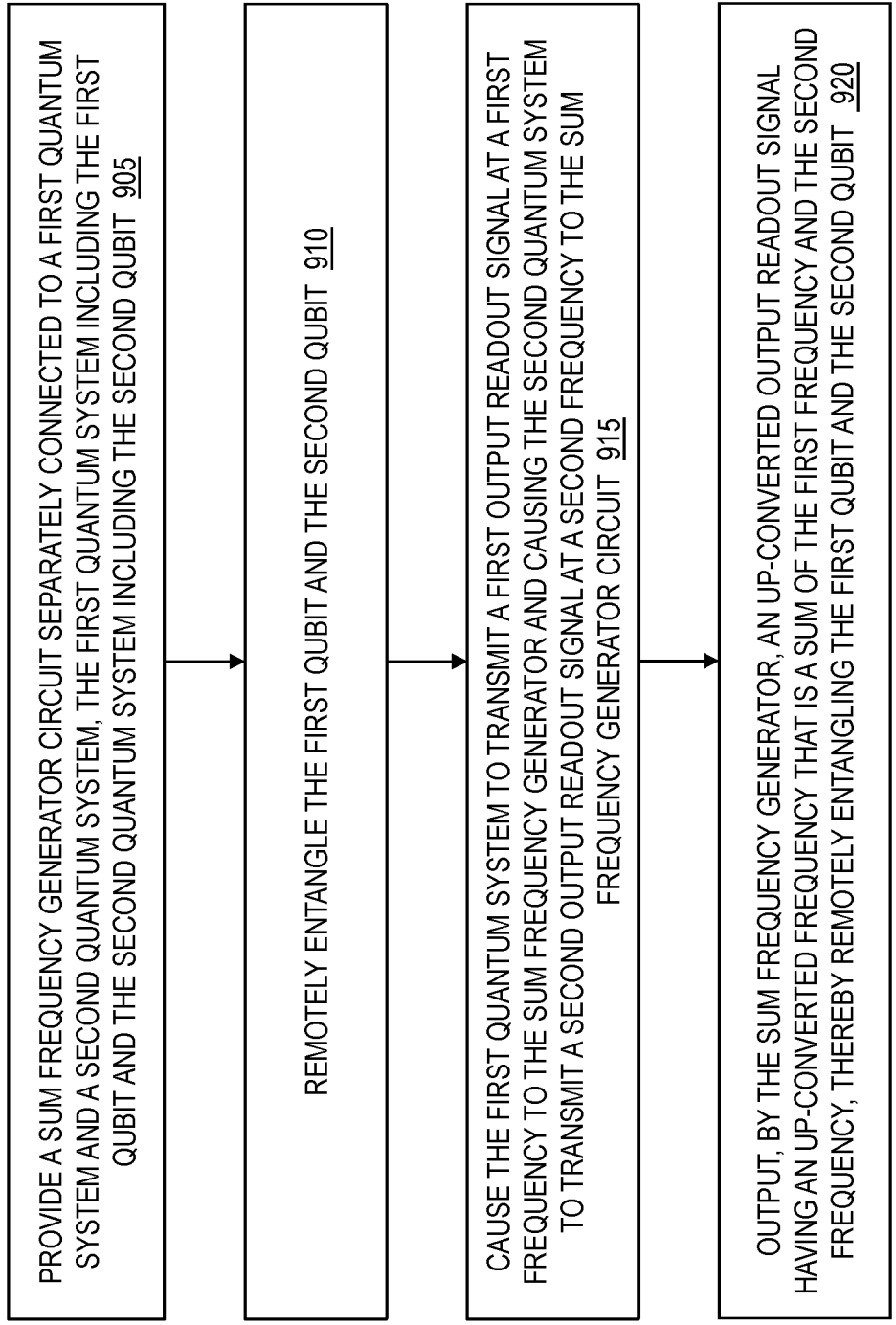
FIG. 9 is a flow chart of a method for remote entanglement of a first qubit and a second qubit according to one or more embodiments.

FIG. 9 is a flow chart 900 of a method for remote entanglement of a first qubit 611 and a second qubit 612 according to one or more embodiments. At block 905, a sum frequency generator circuit 100 separately connected to a first quantum system 601 and a second quantum system 602 is provided. The first quantum system 601 includes the first qubit 611 and the second quantum system 602 includes the second qubit 612.

At block 910, the sum frequency generator circuit 100 is configured to remotely entangle the first qubit 611 and the second qubit 612. By receiving the input readout signal 605, the first quantum system 601 is configured to transmit a first output readout signal 605' at a first frequency $\omega_r+\omega$ to the sum frequency generator circuit 100, and by receiving the input readout signal 610, the second quantum system 602 is configured to transmit a second output readout signal 610' at a second frequency $\omega_r-\omega$ to the sum frequency generator circuit 100 at block 915.

At block 920, the sum frequency generator circuit 100 is configured to output an up-converted output readout signal 165 having an up-converted frequency $2\omega_r$ that is a combination/summation of the first frequency $\omega_r+\omega$ and the second frequency $\omega_r-\omega$, thereby remotely entangling the first qubit 611 and the second qubit 612.

The first output readout signal 605' includes state information $|e_1\rangle$, $|g_1\rangle$ of the first qubit 611 and the second output readout signal 610' includes state information $|e_2\rangle$, $|g_2\rangle$ of the second qubit 612.

The up-converted output readout signal 615 is a superposition of the state information $|e_1 e_2\rangle$, $|e_1 g_2\rangle$, $|g_1 g_2\rangle$, $|g_1 e_2\rangle$ of the first and the second qubits 611, 612.

FIG. 10 is a flow chart 1000 of a method for configuring a microwave repeater 700 according to one or more embodiments. At block 1005, a first sum frequency generator through a last sum frequency generator (e.g., SFG 100_1 and 100_2) are provided. At block 1010, a first spontaneous parametric down-conversion device through a last spontaneous parametric down-conversion device (e.g., SPDC 1, 2, and 3).

At block 1015, each of the first through last sum frequency generators (e.g., SFG 100_1 and 100_2) is connected to (i.e., receives photons from) two of the first through last spontaneous parametric down-conversion devices (e.g., SPDC 1, 2, and 3), such that each one of the first through last sum frequency generators is shared by two of the first through last spontaneous parametric down-conversion devices.

At block 1020, a total (e.g., N−1) of the first through last sum frequency generators is one less than a total (e.g., N) of the first through last spontaneous parametric down-conversion devices. It should be appreciated that, although only 3 SPDC devices (i.e., N) and only 2 SFG circuits (i.e., N−1) are illustrated in FIG. 7 for explanation purposes and not limitation, N can be extended to more than 3 by analogy.

A first photon 701 generated by the first spontaneous parametric down-conversion device (e.g., SPDC 1) is received by none of the first through last sum frequency generators (SFG 100_1 and 100_2). A last photon 706 generated by the last spontaneous parametric down-conversion device (SPDC 3) is received by none of the first through last sum frequency generators (SFG 100_1 and 100_2). The first through last sum frequency generators (SFG 100_1 and 100_2) are configured to cause remote entanglement of the first and second photons 701 and 706. The first through last spontaneous parametric down-conversion devices (SPDC 1, 2, and 3) are, for example, nondegenerate, three-wave mixing amplifiers.

Technical benefits include a quantum device that operates in the microwave domain (e.g. 1-30 GHz). The quantum device is configured to perform sum frequency generation, i.e., up-converting a pair of microwave photons entering the ports of the quantum device at frequencies $f_S$, $f_I$ and momenta $k_S, k_I$ to an outgoing photon whose energy and momentum are equal to the sum of the energy $f_{UPC}=f_I+f_S$ and momentum of the input photons $k_{UPC}=k_I+k_S$. Technical benefits and advantages include remote entanglement of two qubits where heralded entanglement generation is sufficient for distributed quantum computing. The quantum device, as a sum frequency generator, is a key element in device-independent quantum key distribution schemes such as for quantum communication. The quantum device, as a sum frequency generator, is a key element in a quantum microwave repeater utilized in quantum communication. Further, technical benefits include making the up-converted signal a resonant mode of the device in addition to the signal and idler by creating a hybrid type JPC that combines microstrip resonators and lumped-element resonators. Additionally, technical benefits include designing the JRM and the electromagnetic environment of the JRM such that the device can function as a sum frequency generator, satisfying $f_{UPC}=f_S+f_I$ and $\gamma_a$, $\gamma_b \lesssim g_3$, $\gamma_{2ph} \lesssim \gamma_c$, where $\gamma_{2ph}=4g_3^2/\gamma_c$.

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A circuit comprising:
  a first resonator coupled to a mixing element; and
  a second resonator coupled to the mixing element, the second resonator being configured to have a first harmonic and no second harmonic.

2. The circuit of claim 1, wherein the first resonator comprises a first frequency.

3. The circuit of claim 2, wherein the second resonator comprises a second frequency.

4. The circuit of claim 1, wherein the first resonator is configured to receive a first photon at a first frequency.

5. The circuit of claim 4, wherein the second resonator is configured to receive a second photon at a second frequency.

6. The circuit of claim 5, wherein the mixing element is configured to receive a third frequency as a sum of the first and second frequencies.

7. The circuit of claim 6, wherein the first resonator is configured to output an up-converted photon at the third frequency.

8. The circuit of claim 5, wherein the first frequency of the first photon and the second frequency of the second photon are about a same.

9. The circuit of claim 3, wherein the first frequency of the first resonator and the second frequency of the second resonator are about a same.

10. The circuit of claim 1, wherein a fundamental resonance frequency of the second resonator is higher than the first resonator.

11. The circuit of claim 5, wherein the second frequency of the second photon is higher than the first frequency of the first photon.

12. The circuit of claim 6, wherein the first resonator has a second harmonic configured to output an up-converted photon at the third frequency; and
  wherein the up-converted photon is a sum of energy from the first photon and the second photon.

13. The circuit of claim 1, wherein the first resonator is a half-wavelength transmission line resonator.

14. The circuit of claim 13, wherein the second resonator is a lumped-element resonator.

15. The circuit of claim 1, wherein the first resonator is formed of microstrips.

16. The circuit of claim 1, wherein the second resonator is formed of capacitors, each having a top plate connected to the mixing element and a bottom plate connected together, separated by a dielectric substrate or medium.

17. A method of forming a circuit, the method comprising:
  coupling a first resonator to a mixing element; and
  coupling a second resonator to the mixing element, the second resonator being configured to have a first harmonic and no second harmonic.

18. The method of claim 17, wherein the first resonator comprises a first frequency and the second resonator comprises a second frequency.

19. A method for remote entanglement, the method comprising:
  receiving, by a circuit, a first signal associated with a first qubit and a second signal associated with a second qubit; and
  outputting, by the circuit, an up-converted signal comprising first states of the first signal and second states of the second signal.

20. The method of claim 19, wherein the up-converted signal comprising the first states of the first signal and the second states of the second signal heralds a remote entanglement of the first qubit and the second qubit.

* * * * *